US005880597A

United States Patent [19]
Lee

[11] Patent Number: 5,880,597
[45] Date of Patent: Mar. 9, 1999

[54] INTERLEAVED INTERCONNECT FOR PROGRAMMABLE LOGIC ARRAY DEVICES

[75] Inventor: Fung Fung Lee, Milpitas, Calif.

[73] Assignee: Altera Corporation, San Jose, Calif.

[21] Appl. No.: 759,270

[22] Filed: Dec. 2, 1996

Related U.S. Application Data

[60] Provisional application No. 60/025,194, Sep. 18, 1996.
[51] Int. Cl.[6] .............................................. H03K 19/177
[52] U.S. Cl. ............................................. 326/41; 326/38
[58] Field of Search ................................. 326/37, 39, 41, 326/47

[56] References Cited

U.S. PATENT DOCUMENTS

| Re. 34,363 | 8/1993 | Freeman | 307/465 |
|---|---|---|---|
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |

(List continued on next page.)

FOREIGN PATENT DOCUMENTS

| 463746 A2 | 1/1992 | European Pat. Off. | G06F 15/60 |
|---|---|---|---|
| 630115 A2 | 12/1994 | European Pat. Off. | H03K 19/177 |
| WO 95/04404 | 2/1995 | WIPO | H03K 19/177 |
| WO 95/22205 | 8/1995 | WIPO | H03K 19/177 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable LogicArrays—Cheaper by the Millions," Electronics, Dec. 11, 1967, pp. 90–95.

*Recent Developments in Switching Theory,* A. Mukhopadhyay, ed., Academic Press, New York, 1971, chapters VI and IX, pp. 229–254 and 369–422.

*The Programmable Gate Array Data Book,* 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook,* Apr. 1992, Actel Corporation, Sunnyvale, CA, pp. 1–35 through 1–44.

*The Programmable Logic Data Book,* 1994, Xillinx, Inc., San Jose, CA, pp. 2–7, 2–12, and 2–13. "XC5000 Logic Cell Array Family, Technical Data, Advance Information," Xilnx, Inc., Feb. 1995.

*Primary Examiner*—Jon Santamauro
*Assistant Examiner*—Don Phu Le
*Attorney, Agent, or Firm*—Fish & Neave; Robert R. Jackson; Walter M. Egbert

[57] ABSTRACT

A programmable logic array integrated circuit device has a plurality of regions of programmable logic disposed on the device in a two-dimensional array of intersecting rows and columns of such regions. Horizontal interconnection conductors are provided between adjacent rows of the logic regions. Vertical interconnection conductors are provided between adjacent columns of the logic regions. The logic regions in adjacent rows can use the interconnection conductors between those rows. Similarly, the logic regions in adjacent columns can use the interconnection conductors between those columns. This sharing of horizontal and/or vertical conductors by the logic regions on both sides of those horizontal and/or vertical conductors makes more efficient use of the conductors, may simplify and/or shorten interconnection paths, and has other important advantages.

43 Claims, 4 Drawing Sheets

U.S. PATENT DOCUMENTS

| | | | |
|---|---|---|---|
| 5,023,606 | 6/1991 | Kaplinsky | 340/825.8 |
| 5,073,729 | 12/1991 | Greene et al. | 307/465.1 |
| 5,121,006 | 6/1992 | Pedersen | 307/465 |
| 5,122,685 | 6/1992 | Chan et al. | 307/465.1 |
| 5,132,571 | 7/1992 | McCollum et al. | 307/465.1 |
| 5,144,166 | 9/1992 | Camarota et al. | 307/465.1 |
| 5,208,491 | 5/1993 | Ebeling et al. | 307/465 |
| 5,218,240 | 6/1993 | Camarota et al. | 307/443 |
| 5,220,214 | 6/1993 | Pedersen | 307/465 |
| 5,225,719 | 7/1993 | Agrawal et al. | 307/465 |
| 5,255,203 | 10/1993 | Agrawal et al. | 364/489 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,317,698 | 5/1994 | Chan | 326/47 |
| 5,323,069 | 6/1994 | Smith et al. | 326/47 |
| 5,327,023 | 7/1994 | Kawana et al. | 326/47 |
| 5,338,984 | 8/1994 | Sutherland | 307/465.1 |
| 5,350,954 | 9/1994 | Patel | 307/465 |
| 5,371,422 | 12/1994 | Patel et al. | 326/41 |
| 5,448,186 | 9/1995 | Kawata | 326/41 |
| 5,455,525 | 10/1995 | Ho et al. | 326/41 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,682,107 | 10/1997 | Tavana et al. | 326/41 |

INTERLEAVED INTERCONNECT FOR PROGRAMMABLE LOGIC ARRAY DEVICES

This application claims the benefit of provisional application No. 60/025,194, filed Sep. 18, 1996.

BACKGROUND OF THE INVENTION

This invention relates to programmable logic array integrated circuit devices, and more particularly to the interconnection resources that are provided in such devices.

Certain programmable logic array devices have regions of programmable logic disposed on the device in a two-dimensional array of intersecting rows and columns of such regions. Examples of this general type of device are shown in Pedersen et al. U.S. Pat. No. 5,260,610, Cliff et al. U.S. Pat. No. 5,260,611, Cliff et al. U.S. Pat. No. 5,689,195, and Cliff et al. U.S. patent application Ser. No. 08/672,676, filed Jun. 28, 1996. (All of these references are hereby incorporated by reference herein.) Generally in such devices, horizontal conductors are associated with each row of logic regions for conveying signals to, from, and between the logic regions in that row. Similarly, vertical conductors are associated with each column of logic regions for conveying signals to, from, and between the logic regions in that column or the rows of logic regions along that column. Programmable (or, in some limited instances, fixed) interconnections are provided for connecting (1) signals on the horizontal conductors associated with each row to inputs of the logic regions in that row, (2) outputs of the logic regions in each row to the horizontal conductors associated with that row, and (3) the horizontal conductors associated with each row to the vertical conductors crossing that row. Additional programmable (or, in some limited instances, fixed) connections may be provided for connecting the outputs of the logic regions in each column to the vertical conductors associated with that column.

Exclusive association of each row of logic regions with its own group of horizontal conductors, and similar exclusive association of each column of logic regions with its own group of vertical conductors, may increase the overall numbers of such conductors that are needed on a device or may limit usability of the device for given numbers of such conductors. For example, if the logic regions in each row can only use the horizontal conductors associated with that row, each row must be provided with enough horizontal conductors to satisfy the maximum possible demand for horizontal interconnection along a row. (It will be understood that the "maximum possible demand" referred to may not be an absolute maximum, but only a somewhat smaller demand, which the device designer has concluded is sufficient to meet the requirements of most of the probable uses of the device.) This may mean that substantial numbers of horizontal conductors are unused in rows that do not require as much horizontal interconnection. As another example, because all interconnections between rows—even immediately adjacent rows—require use of vertical conductors, the demand for vertical conductors is increased by the unique or exclusive association of each row with a particular group of horizontal conductors.

In view of the foregoing, it is an object of this invention to improve the interconnection resources that are provided on programmable logic array integrated circuit devices.

It is a more particular object of this invention to provide programmable logic array devices that make more efficient use of the interconnection conductors with which they are provided.

It is still another object of the invention to allow programmable logic devices to be provided with fewer interconnection conductors with no reduction in the usability of the devices, or to increase the usability of the devices for a given amount of interconnection conductor resources.

SUMMARY OF THE INVENTION

These and other objects of the invention are accomplished in accordance with the principles of the invention by providing programmable logic devices in which the regions of programmable logic in each row and/or column can make substantially full use of the horizontal and/or vertical interconnection conductors on each side of that row and/or column. Thus the horizontal and/or vertical conductors between any two adjacent rows and/or columns can be used by the logic regions in both of those rows and/or columns. This makes more efficient use of the horizontal and/or vertical conductors, thereby possibly allowing the numbers of such conductors to be reduced or increasing the usability of the device for a given number of interconnection conductors that are provided. For example, interconnections can now be provided between logic regions in adjacent rows without having to use vertical conductors to make those interconnections.

Further features of the invention, its nature and various advantages, will be more apparent from the accompanying drawings and the following detailed description of the preferred embodiments.

DETAILED DESCRIPTION OF THE PREFERRED EMBODIMENTS

Figure 1:
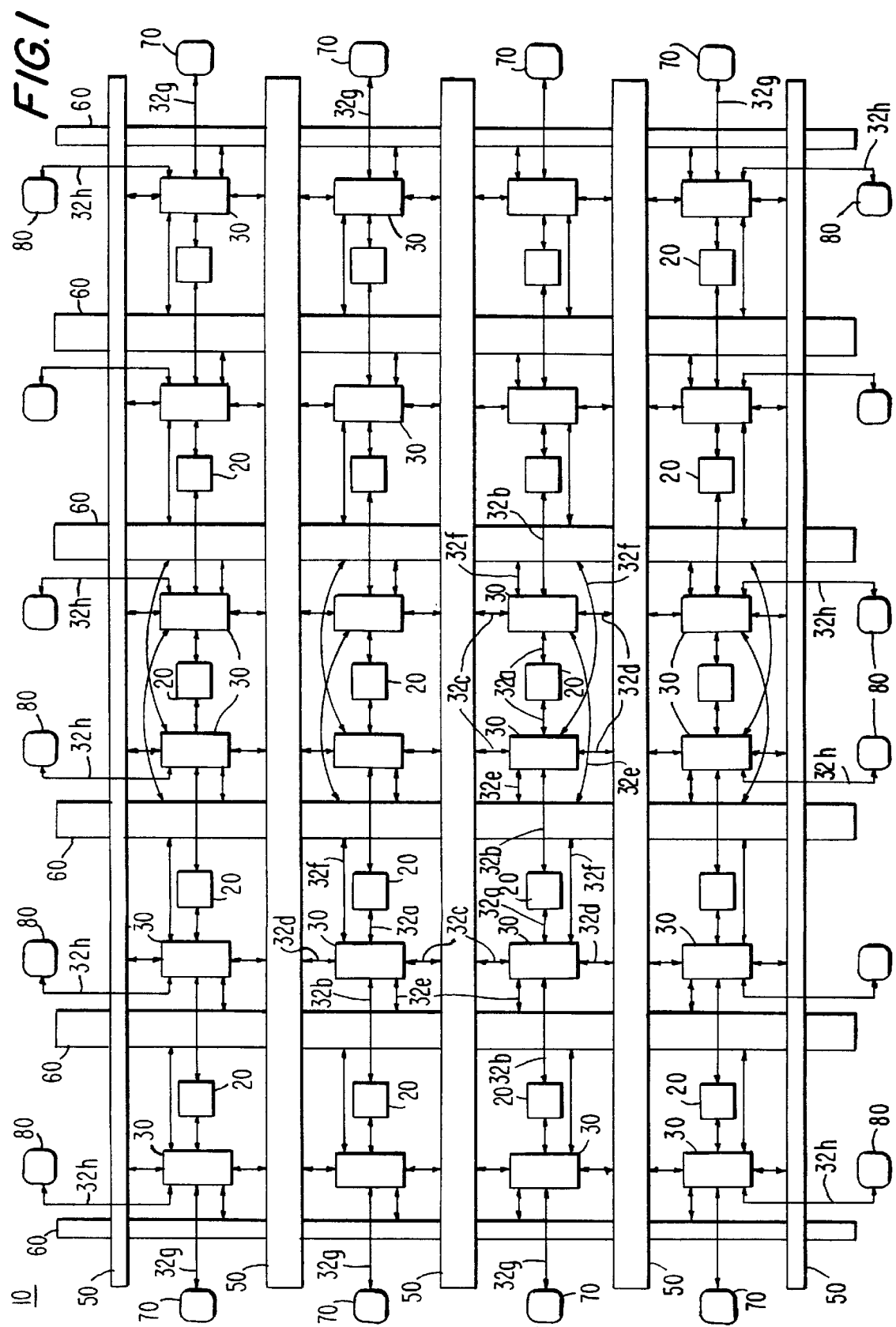
FIG. 1 is a simplified schematic block diagram of an illustrative embodiment of a programmable logic array integrated circuit device constructed in accordance with the principles of this invention.

In the illustrative embodiment shown in FIG. 1, programmable logic array integrated circuit device 10 includes a two-dimensional array of intersecting rows and columns of regions 20 of programmable logic. Each region 20 may include a plurality of logic modules (e.g., logic modules 22 in FIG. 2), each of which is programmable to perform any of several logic functions. For example, each logic module 22 may include a four-input look-up table that is programmable to produce an output signal which is any logical combination of the four inputs to that look-up table. Each logic module 22 may also include a register and associated switches for selectively registering the look-up table output to produce one or more final output signals of the logic module. Examples of suitable logic modules are shown in the references mentioned above, but it will be understood that other types or constructions of logic modules can be used if desired.

Each logic region 20 has at least one programmable logic connector ("PLC") array 30 associated with it. The purpose of each PLC array 30 is to programmably selectively connect the inputs and outputs of the associated logic region 20 to one another and to interconnection conductors (such as 50 and 60) that are adjacent to the associated logic region. Each PLC array 30 may also make other connections as will be described in more detail below.

Horizontal interconnection conductors 50 are interspersed between the rows of logic regions 20 and their associated PLC arrays 30. Each area identified by a reference number 50 represents a plurality of horizontal conductors. Some of the horizontal conductors in each group 50 may span the entire width of device 10, while other horizontal conductors in each group may only span a portion of the width of the device.

Vertical interconnection conductors 60 are interspersed between the columns of logic regions 20 and their associated PLC arrays 30. Each area identified by a reference member 60 represents a plurality of vertical conductors. Some of the vertical conductors in each group may span the entire height of device 10, while other vertical conductors in each group may only span a portion of the height of the device.

Adjacent to each end of each row of logic regions 20 is a plurality of input/output ("I/O") pins 70. Thus each area identified by a reference number 70 represents several I/O pins which are not shown individually. Adjacent each end of each column of logic regions 20 is a plurality of I/O pins 80. Again, each area identified by a reference number 80 represents several I/O pins which are not shown individually. I/O pins 70 and 80 are used to make connections between device 10 and external circuitry. To additionally distinguish pins 70 and 80 from one another, pins 70 may sometimes be referred to as horizontal I/O pins (because they are at the ends of rows of logic regions 20) and pins 80 may sometimes be referred to as vertical I/O pins (because they are at the ends of columns of logic regions 20).

It will be noted that device 10 is symmetrical about its center column of logic regions 20. Device 10 is also symmetrical about its central group of horizontal conductors 50.

It will be understood that the numbers of the various components shown in FIG. 1 is only illustrative, and that any other desired numbers of such components may be provided. For example, more or less than four rows and five columns of logic regions may be provided. It will also be understood that terms like "row" and "column", "horizontal" and "vertical", "left" and "right", "above" and "below", and the like are used herein solely for convenience. No absolute or fixed orientations or directions are intended by the use of these terms, and they are freely interchangeable.

FIG. 1 illustrates the manner in which each PLC array 30 is programmably connectable to adjacent components such as logic regions 20, horizontal conductors 50, vertical conductors 60, and I/O pins 60 and/or 70. For example, the representative PLC array 30 in the third row from the top and the second column from the left is programmably connectable via conductors 32*a* to the logic region 20 in that same row and column. This same representative PLC array 30 is programmably connectable via conductors 32*b* to the logic region 20 in the adjacent column to the left. (In columns to the right of the center column, conductors 32*b* connect the PLC array 30 to the logic region in the adjacent column to the right. This is a consequence of the above-mentioned symmetry of device 10 about the center column of logic regions 20.) The representative PLC array 30 is also programmably connectable to the adjacent horizontal conductors 50 above and below by conductors 32*c* and 32*d*, respectively. (For PLC arrays 30 above the horizontal centerline of device 10, "above" and "below" are reversed in the preceding sentence.) And the representative PLC array 30 is programmably connectable to the adjacent vertical conductors 60 to the left and right by conductors 32*e* and 32*f*, respectively. (For PLC arrays 30 to the right of the vertical centerline of device 10, "left" and "right" are reversed in the preceding sentence.) At the ends of each row, conductors 32*g* are used for connections between PLC arrays 30 and adjacent horizontal I/O pins 70. At the ends of each column, conductors 32*h* are used for connections between PLC arrays 30 and adjacent vertical I/O pins 80.

Although the connections described in the preceding paragraph are generally referred to as programmable, it will be understood that some of these connections may be fixed (i.e., non-programmable). This point is discussed in more detail below.

The center column in FIG. 1 may appear to be significantly different from the other columns because two PLC arrays 30 are shown for each row in that column. In fact, however, the difference is relatively small if one views the two PLC arrays 30 in any given row of the center column as two parts of a single PLC array 30. Then it will be seen that the only difference between this PLC array and other PLC arrays 30 along the same row is that this PLC array 30 (in the center column) has connections 32*b* to the logic regions 20 in the adjacent columns to both the left and the right.

It will be understood that each reference number 32 in FIG. 1 identifies a plurality of conductors or connections. Also, the ends of conductors 32 remote from PLC arrays 30 may be either programmable or, in some instances, fixed connections to the elements to which those conductors 32 lead. If these connections are programmable, they may be provided by other programmable logic connectors ("PLCs"). For example, each conductor 32*c* or 32*d* may have a programmable connection to one horizontal conductor 50, or several programmable connections to several horizontal conductors 50. Alternatively, certain conductors 32*c* or 32*d* may have fixed connections to particular horizontal conductors 50. Any desired population densities and patterns may be used for these connections of conductors 32 remote from PLC arrays 30. Each conductor 32 may be bidirectional, or each group of conductors 32 may include unidirectional conductors, some of which are only capable of conveying signals to the associated PLC array 30, while others are only capable of conveying signals from the associated PLC array 30.

Figure 2:
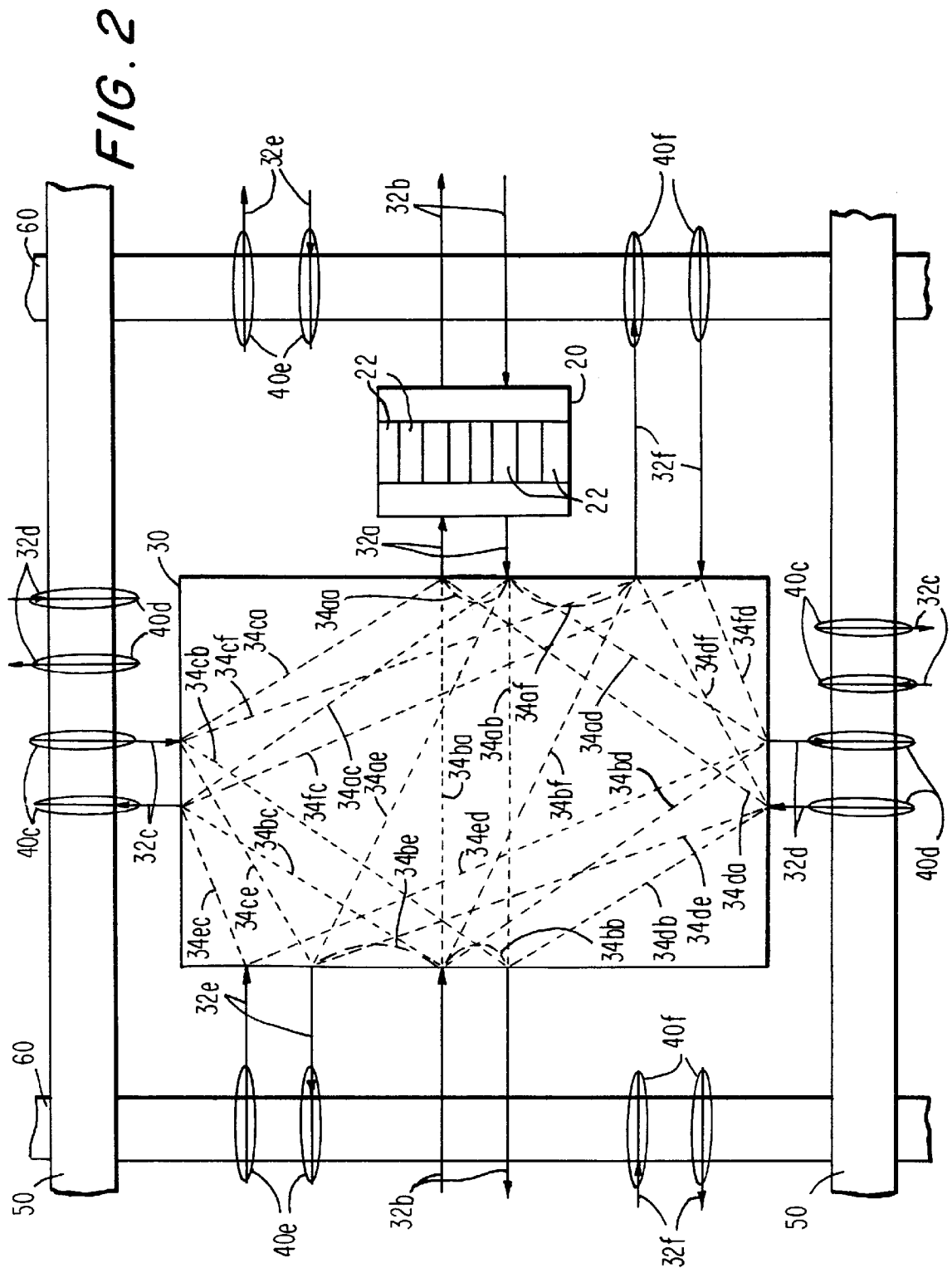
FIG. 2 is a simplified schematic block diagram of an illustrative embodiment of a representative portion of the FIG. 1 device shown in somewhat more detail.

Each PLC array 30 is programmable to make connections between the various conductors 32 that are connected to it. An illustrative embodiment of a representative PLC array 30 is shown in more detail in FIG. 2 to depict the various types of connections that can be made by the PLC array in this embodiment. The PLC array 30 shown in FIG. 2 is the PLC array in the third row from the top and the second column from the left in FIG. 1. FIG. 2 shows each group of conductors 32 from FIG. 1 as separate groups of inbound conductors (to PLC array 30) and outbound conductors (from PLC array 30). This is done for convenience herein, and it will be understood that some or all of the actual physical conductors 32 may be capable of bidirectional signaling as has been mentioned. Note that a FIG. like FIG. 2 for a PLC array 30 to the right of the FIG. 2 array and to the right of the vertical centerline of device 10 would be just a left-to-right mirror image of FIG. 2. Similarly, a FIG. like FIG. 2 for a PLC array 30 above the FIG. 2 array and above the horizontal centerline of device 10 would be a top-to-bottom mirror image of FIG. 2.

In FIG. 2 the various types of programmable connections that can be made by PLC array 30 are shown by dotted lines 34. For example, programmable connections 34*aa* can be made between inbound conductors 32*a* and outbound conductors 32*a*. Similarly, programmable connections 34*bb* can be made between inbound conductors 32*b* and outbound conductors 32*b*. All of the various types of connections that can be made by PLC array 30 are identified by the rows in the following table.

TABLE I

| Inbound Conductor | Programmably Connectable to Outbound Conductor | Via a Programmable Connection |
|---|---|---|
| 32a | 32a | 34aa |
| 32a | 32b | 34ab |
| 32a | 32c | 34ac |
| 32a | 32d | 34ad |
| 32a | 32e | 34ae |
| 32a | 32f | 34af |
| 32b | 32a | 34ba |
| 32b | 32b | 34bb |
| 32b | 32c | 34bc |
| 32b | 32d | 34bd |
| 32b | 32e | 34be |
| 32b | 32f | 34bf |
| 32c | 32a | 34ca |
| 32c | 32b | 34cb |
| 32c | 32e | 34ce |
| 32c | 32f | 34cf |
| 32d | 32a | 34da |
| 32d | 32b | 34db |
| 32d | 32e | 34de |
| 32d | 32f | 34df |
| 32e | 32c | 34ec |
| 32e | 32d | 34ed |
| 32f | 32c | 34fc |
| 32f | 32d | 34fd |

The interconnectability shown for PLC array 30 in FIG. 2 and described in Table I above is only illustrative. Other programmable interconnections may be added to FIG. 2 and Table I if desired, or certain of the interconnections shown in FIG. 2 and described in Table I may be omitted if desired.

PLC array 30 may be constructed to produce the desired interconnections in any suitable way. For example, all inputs may be placed on conductors in PLC array 30 that are substantially parallel to one another, and all outputs may be on other conductors in the array that cross over the input conductors substantially perpendicularly to the input conductors. Programmable interconnections may be provided at all or any desired subset of the intersections between the input and output conductors in the array to selectively connect the intersecting input and output conductors.

FIG. 2 also shows (by ellipses 40) more detail regarding the connections between conductors 32 and horizontal and vertical conductors 50 and 60. For example, ellipses 40*c* show that connections between each group of conductors 32*c* and the associated group of horizontal conductors 50 are distributed across that entire group of horizontal conductors. It may not be necessary for every conductor 32*c* to be connected to every associated horizontal conductor 50, but the connections that are provided are preferably distributed across the entire associated group of conductors 50. Similarly, connections 40*d* between each group of conductors 32*d* and the associated group of conductors 50 are distributed across that entire group of conductors 50. The same is true for connections 40*e* and 40*f*. Each group of such connections is preferably distributed over the entire associated group of vertical conductors 60. As has been mentioned, connections 40 may be additional PLCs, or some of these connections may be non-programmable (i.e., fixed).

To summarize the functionality of PLC arrays 30 and associated connections 40 of the type shown in FIG. 2, local interconnect from the outputs to the inputs of the logic modules 22 in depicted logic region 20 is provided by programmable connections 34*aa* in the depicted PLC array 30, and also by programmable connections 34*bb* in the PLC array 30 in the column to the right. Substantially direct communication between horizontally adjacent logic regions 20 can be provided via programmable connections 34*ab* and 34*ba*. Such communication between horizontally adjacent logic regions advantageously avoids the need to use horizontal conductors 50 for these connections. Depicted logic region 20 can receive signals via programmable connections 34*ca* and 34*da* from the adjacent horizontal conductors 50 that are either above or below that logic region. Additional interconnection capacity of this kind is provided by programmable connections 34*cb* and 34*db* in the PLC array 30 in the column to the right. Similarly, depicted logic region 20 can output via programmable connections 34*ac*, 34*ad*, 34*ae*, and 34*af* to the adjacent horizontal conductors 50 above or below that logic region or the adjacent vertical conductors 60 to the left or right of that logic region. Additional interconnection capacity of this kind is provided by programmable connections 34*bc*, 34*bd*, 34*be*, and 34*bf* in the PLC array 30 in the column to the right. (Note that this structure gives the outputs of depicted logic region 20 access to vertical conductors 60 in three different columns. Stated another way, the outputs of three horizontally adjacent logic regions 20 can be applied to the vertical conductors 60 that are adjacent to one of those three regions 20.) Horizontal conductor 50 to vertical conductor 60 connections can be made via programmable connections 34*ce*, 34*cf*, 34*de*, and 34*df*. Vertical conductor 60 to horizontal conductor 50 connections can be made via programmable connections 34*ec*, 34*ed*, 34*fc*, and 34*fd*.

Note that in this embodiment direct connections are not provided from vertical conductors 60 to logic region inputs 32*a* and 32*b*. Thus horizontal conductor resources 50 must be used to provide such signal paths. However, additional programmable connections 34 could be provided in PLC arrays 30 to provide such signal paths if desired. Following the nomenclature used in FIG. 2 and Table I, such additional connections 34 would be connections 34*ea*, 34*fa*, 34*eb*, and/or 34*fb*.

The fact that PLC arrays 30 allow each logic region 20 in each row to output to or input from the full set of horizontal conductors 50 above and below that logic region allows communication between logic regions in adjacent rows without the need to use vertical conductors 60 for such communication. For example, in order to apply a signal from a first logic region 20 in a first row to a second logic region 20 in an adjacent second row, a PLC array 30 associated with the first logic region connects the output signal 32*a* or 32*b* of that logic region to a horizontal conductor 50 in the group of such conductors that is between the first and second rows. A PLC array 30 associated with the second logic region connects that horizontal conductor 50 to the input(s) 32*a* or 32*b* of the second logic region. No vertical conductors 60 are involved in making this connection between logic regions in adjacent rows. This conserves vertical conductor resources, possibly allowing the number of vertical conductors 60 to be reduced with no loss of device usability, or increasing device usability for a given number of vertical conductors. In addition, timing performance along critical paths may improve because shorter and more local lines may be used. For example, it may now be possible to traverse a critical path which extends from the top row to the bottom row of the device without going through any vertical conductors 60.

Another advantage of the device designs of this invention is that adjacent rows of logic regions effectively share the horizontal conductor 50 resources that are disposed between those rows. This sharing of horizontal conductor resources makes more efficient use of those resources. For example, a row of logic regions 20 that needs a large amount of horizontal interconnection can effectively "borrow" some of the needed horizontal conductors 50 from adjacent rows that do not need all of their horizontal conductors. All rows do not have to be provided with the full number of horizontal conductors 50 that any row might need in a "worst case" use of the device. This again may allow the number of horizontal conductors to be reduced with no loss of device usability, or it may increase device usability for a given amount of horizontal conductor resources. The ability of the PLC arrays 30 in adjacent columns to similarly output to or input from the vertical conductors 60 that are disposed between those columns also makes more efficient use of the vertical conductor resources. This may further reduce the number of vertical conductors 60 that are required for a given device usability or increase device usability for a given number of vertical conductors.

Figure 3:
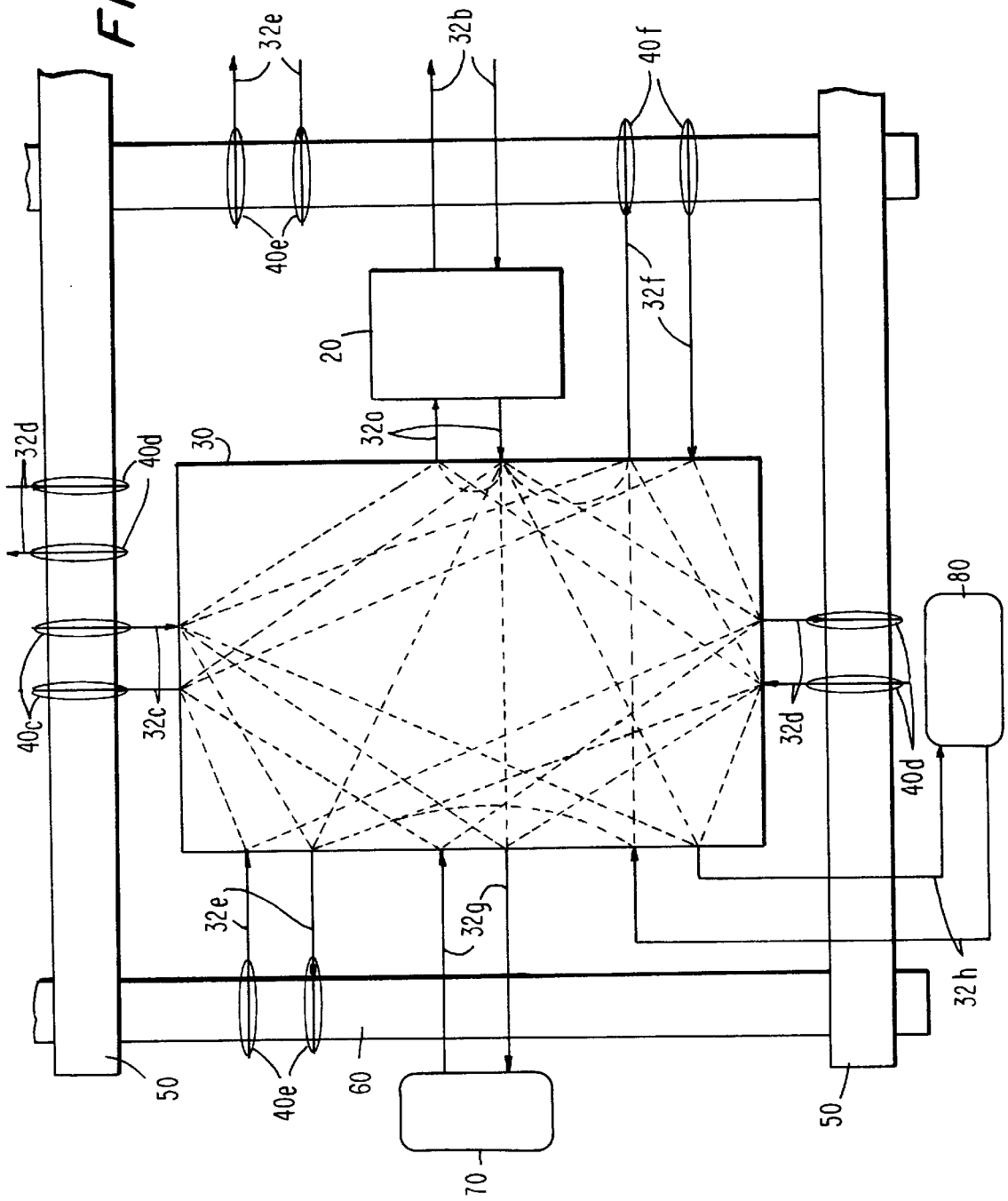
FIG. 3 is a simplified schematic block diagram of an illustrative embodiment of another representative portion of the FIG. 1 device shown in more detail.
Figure 4:
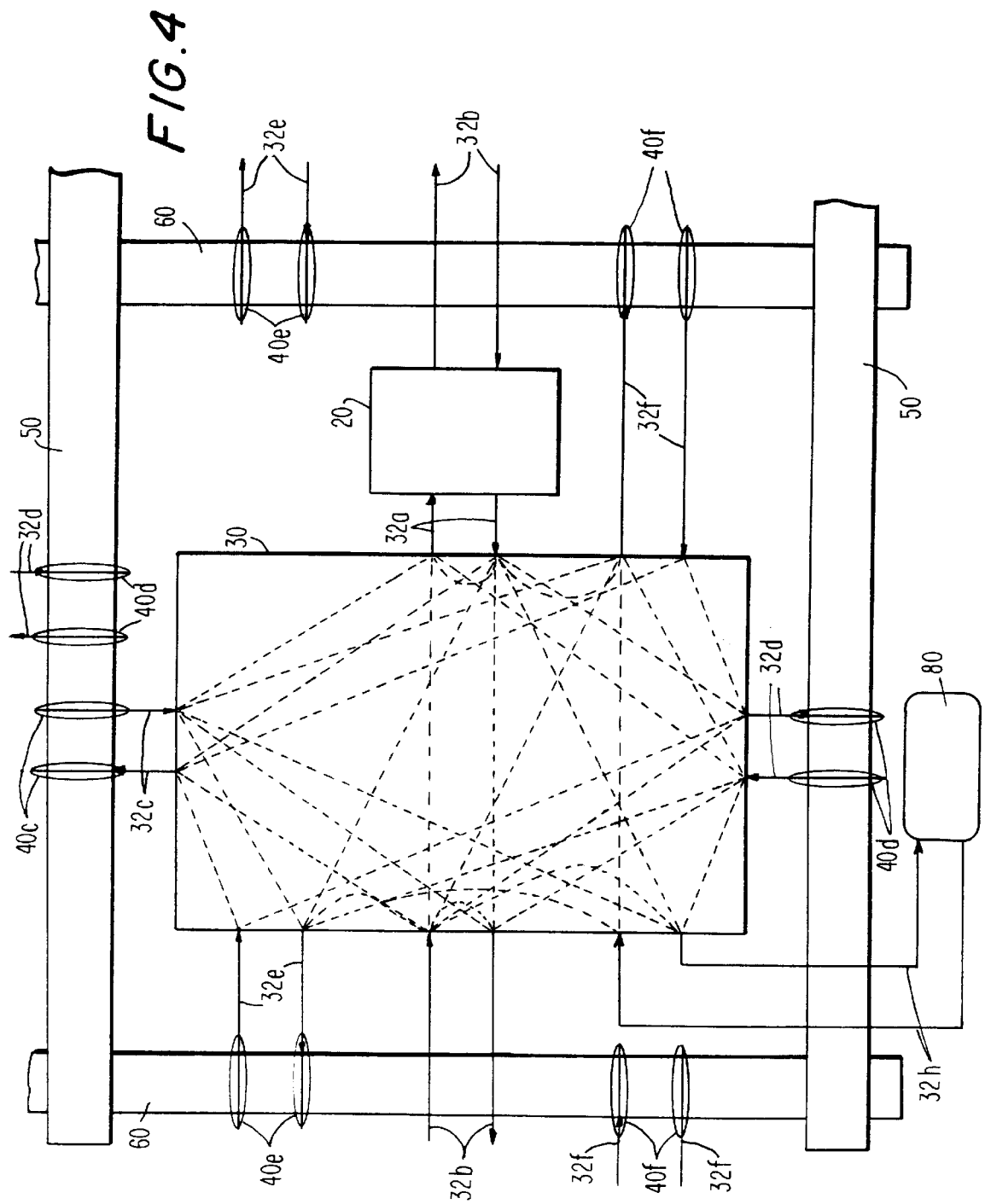
FIG. 4 is a simplified schematic block diagram of an illustrative embodiment of still another representative portion of the FIG. 1 device shown in more detail.

FIGS. 3 and 4 illustrate how PLC arrays 30 may be used to make connections to and from I/O pins 70 and 80. For example, FIG. 3 shows the lower left-hand corner of device 10, where the PLC array 30 makes connections to both a group of horizontal I/O pins 70 and a group of vertical I/O pins 80. FIG. 4 shows the bottom row and second column from the left of device 10, where the PLC array 30 makes connections to a group of vertical I/O pins 80.

Using the same nomenclature as is used above in connection with FIG. 2 and Table I, the following Table II shows all the connections that can be made by the PLC array 30 in FIG. 3. To save space in the text and to avoid overcrowding FIG. 3, the third column of Table I is omitted from Table II and the reference numbers 34 are omitted from FIG. 3 and Table II. Also, to shorten Table II, the left-hand two columns of that Table continue in the right-hand two columns of the Table, and in any given row the left-hand two entries are independent of the right-hand two entries.

TABLE II

| Inbound Conductor | Programmably Connectable to Outbound Conductor | Inbound Conductor | Programmably Connectable to Outbound Conductor |
| --- | --- | --- | --- |
| 32a | 32a | 32d | 32a |
| 32a | 32c | 32d | 32e |
| 32a | 32d | 32d | 32f |
| 32a | 32e | 32d | 32g |
| 32a | 32f | 32d | 32h |
| 32a | 32g | 32g | 32c |
| 32a | 32h | 32g | 32d |
| 32c | 32a | 32h | 32e |
| 32c | 32e | 32h | 32f |
| 32c | 32f | | |
| 32c | 32g | | |
| 32c | 32h | | |

Again, using the same nomenclature and format as are used for Table II, Table III shows all of the connections that can be made by PLC array 30 in FIG. 4.

TABLE III

| Inbound Conductor | Programmably Connectable to Outbound Conductor | Inbound Conductor | Programmably Connectable to Outbound Conductor |
| --- | --- | --- | --- |
| 32a | 32a | 32d | 32a |
| 32a | 32b | 32d | 32b |
| 32a | 32c | 32d | 32e |
| 32a | 32d | 32d | 32f |
| 32a | 32e | 32d | 32h |
| 32a | 32f | 32e | 32c |
| 32a | 32h | 32e | 32d |
| 32b | 32a | 32f | 32c |
| 32b | 32b | 32f | 32d |
| 32b | 32c | 32h | 32e |
| 32b | 32d | 32h | 32f |
| 32b | 32e | | |
| 32b | 32f | | |
| 32b | 32h | | |
| 32c | 32a | | |
| 32c | 32b | | |
| 32c | 32e | | |
| 32c | 32f | | |
| 32c | 32h | | |

It will be apparent from FIGS. 3 and 4 how the PLC arrays 30 at other locations around the periphery of device 10 can be constructed. As in the case of PLC array 30 in FIG. 2, the PLC arrays 30 in FIGS. 3 and 4 can have connections in addition to those shown and/or some of the connections shown can be omitted if desired.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of this invention, and that various modifications can be made by those skilled in the art without departing from the scope and spirit of the invention. For example, the number of logic modules 22 in each logic region 20 can be varied; the number of rows and/or columns of logic regions can be varied; the number of each type of conductor 32, 50, 60, etc., can be varied; the interconnection routes provided in PLC arrays 30 can be varied; the patterns and population densities of connections 40 between conductors 32, on the one hand, and conductors 50 and 60, on the other hand, can be varied; and the number of I/O pins 70 and 80 associated with each row and column of the device can be varied. Different types of logic modules can be used. For example, the logic modules can include look-up tables as mentioned above, or the logic modules can employ product term logic or any other suitable form of programmable logic. Similarly, any of a wide range of technologies can be used to make the various components of device 10 as has been mentioned above.

The invention claimed is:

1. A programmable logic device comprising:
   a plurality of regions of programmable logic disposed on the device in a plurality of rows of said regions;
   interconnection conductors extending along said rows between adjacent ones of said rows; and
   connectors associated with said regions for connecting inputs and outputs of said regions to interconnection conductors that are adjacent to said regions on both sides of said regions so that connections between a first of said regions which is in a first of said rows and a second of said regions which is in a second of said rows adjacent to said first row can be made via interconnection conductors between said first and second rows and without a need to use other interconnection conductors that are not between said first and second rows.

2. The device defined in claim 1 wherein at least some of said interconnection conductors extend along the entire length of a row.

3. The device defined in claim 1 wherein each of said regions comprises a plurality of modules of programmable logic.

4. The device defined in claim 3 wherein each of said modules is programmable to produce a signal which is any of a plurality of logical combinations of a plurality of input signals applied to that module.

5. The device defined in claim 1 wherein said connectors are at least partly programmable with respect to the connections that they make.

6. The device defined in claim 5 wherein said connections selectively connect outputs to inputs of a region without requiring use of said interconnection conductors.

7. The device defined in claim 5 wherein said connectors selectively connect outputs of a region in a row to inputs of an adjacent region in said row without requiring use of said interconnection conductors.

8. The device defined in claim 1 wherein said regions are additionally disposed on said device in a plurality of columns of said regions, said columns intersecting said rows, wherein said device further includes vertical interconnection conductors extending along said columns between adjacent ones of said columns, and wherein said connectors additionally connect outputs of said regions to vertical interconnection conductors that are adjacent to said regions on both sides of said regions.

9. The device defined in claim 8 wherein at least some of said vertical interconnection conductors extend along the entire length of a column.

10. The device defined in claim 8 wherein said connectors connect outputs of regions in three adjacent columns to vertical interconnection conductors that are adjacent to one of said columns.

11. The device defined in claim 8 wherein said connectors connect outputs of regions in one of said columns to vertical interconnection conductors that are adjacent to three of said columns.

12. The device defined in claim 8 wherein said connectors connect interconnection conductors on both sides of a region to vertical interconnection conductors on both sides of said region.

13. The device defined in claim 1 further comprising:
   input/output pins electrically connected to said device via said connectors.

14. The device defined in claim 13 wherein at least one of said input/output pins is associated with each of said rows, and wherein the connectors associated with one of said regions in each of said rows selectively connect the input/output pin associated with said row to said interconnection conductors that are on either side of said row.

15. The device defined in claim 14 wherein said connectors associated with said one of said regions in each of said rows selectively connect the input/output pin associated with said row to said one of said regions in said row.

16. The device defined in claim 8 further comprising:
   a plurality of input/output pins, at least one of which is associated with each of said plurality of columns, and wherein the connectors associated with one of said regions in each of said columns selectively connect the input/output pin associated with said column to said vertical interconnection conductors that are on either side of said column.

17. The device defined in claim 16 wherein said connectors associated with said one of said regions in each of said columns selectively connect the input/output pin associated with said column to said one of said regions in said column.

18. A programmable logic device comprising:
   a plurality of regions of programmable logic disposed on the device in a plurality of rows of said regions;
   interconnection conductors extending along said rows between adjacent ones of said rows; and
   an array of programmable connectors adjacent to each of said regions for selectively connecting inputs and outputs of said adjacent region to interconnection conductors that are adjacent to said region on both sides of said region so that connections between a first of said regions which is in a first of said rows and a second of said regions which is in a second of said rows adjacent to said first row can be made via interconnection conductors between said first and second rows and without a need to use other interconnection conductors that are not between said first and second rows.

19. The device defined in claim 18 wherein said array of programmable connectors adjacent to each of said regions additionally selectively connects inputs and outputs of said adjacent region to inputs and outputs of another region that is adjacent to said adjacent region without requiring use of said interconnection conductors.

20. The device defined in claim 19 wherein said another region is in the same row as said adjacent region.

21. The device defined in claim 19 wherein said array of programmable connectors adjacent to each of said regions additionally selectively connects inputs and outputs of said another region to interconnection conductors that are adjacent to said adjacent region on both sides of said adjacent region.

22. The device defined in claim 18 wherein said array of programmable connectors adjacent to each of said regions selectively connects outputs to inputs of said region without requiring use of said interconnection conductors.

23. The device defined in claim 19 said array of programmable connectors adjacent to each of said regions additionally selectively connects outputs to inputs of said another region without requiring use of said interconnection conductors.

24. The device defined in claim 18 wherein at least some of said interconnection conductors extend along the entire length of a row.

25. The device defined in claim 18 wherein each of said regions comprises a plurality of modules of programmable logic.

26. The device defined in claim 25 wherein each of said modules is programmable to produce a signal which is any of a plurality of logical combinations of a plurality of input signals of that module.

27. The device defined in claim 18 wherein said regions are additionally disposed on said device in a plurality of columns of said regions, said columns intersecting said rows, wherein said device further includes vertical interconnection conductors extending along said columns between adjacent one of said columns, and wherein said array of programmable connectors adjacent to each of said regions additionally selectively connects outputs of said adjacent region to vertical interconnection conductors that are adjacent to said region on both sides of said region.

28. The device defined in claim 27 wherein said array of programmable connectors adjacent to each of said regions additionally selectively connects outputs of another region that is adjacent to said adjacent region to vertical interconnection conductors that are adjacent to said adjacent region on both sides of said adjacent region.

29. The device defined in claim 28 wherein said another region is in the same row as said adjacent region.

30. The device defined in claim 27 wherein said array of programmable connectors adjacent to each of said regions additionally selectively connects interconnection conductors on both sides of said adjacent region to vertical interconnection conductors on both sides of said adjacent region.

31. The device defined in claim 27 wherein at least some of said vertical interconnection conductors extend along the entire length of a column.

32. The device defined in claim 18 further comprising:

input/output pins electrically connected to said device via selected ones of said arrays of programmable connectors.

33. A programmable logic device comprising:

a plurality of regions of programmable logic disposed on the device in a plurality of rows of said regions, each of said regions including a plurality of modules of programmable logic;

interconnection conductors extending along said rows between adjacent ones of said rows; and connectors associated with said regions for connecting inputs and outputs of said regions to interconnection conductors that are adjacent to said regions on both sides of said regions so that connections between a first of said regions which is in a first of said rows and a second of said regions which is in a second of said rows adjacent to said first row can be made via interconnection conductors between said first and second rows and without a need to use other interconnection conductors that are not between said first and second rows.

34. The device defined in claim 33 wherein each of said modules is programmable to produce a signal which is any of a plurality of logical functions of a plurality of input signals applied to that module.

35. The device defined in claim 33 wherein at least some of said interconnection conductors extend along the entire length of a row.

36. The device defined in claim 33 wherein said connectors are at least partly programmable with respect to the connections that they make.

37. The device defined in claim 36 wherein said connectors selectively connect outputs to inputs of a region without requiring use of said interconnection conductors.

38. The device defined in claim 36 wherein said connectors selectively connect outputs of a region in a row to inputs of an adjacent region in said row without requiring use of said interconnection conductors.

39. The device defined in claim 33 wherein said regions are additionally disposed on said device in a plurality of columns of said regions, said columns intersecting said rows, wherein said device further includes vertical interconnection conductors extending along said columns between adjacent ones of said columns, and wherein said connectors additional connect outputs of said regions to vertical interconnection conductors that are adjacent to said regions on both sides of said regions.

40. The device defined in claim 39 wherein at least some of said vertical interconnection conductors extend along the entire length of a column.

41. The device defined in claim 39 wherein said connectors connect outputs of regions in three adjacent columns to vertical interconnection conductors that are adjacent to one of said columns.

42. The device defined in claim 39 wherein said connectors connect interconnection conductors on both sides of a region to vertical interconnection conductors on both sides of said region.

43. The device defined in claim 33 further comprising:

input/output pins electrically connected to said device via said connectors.

\* \* \* \* \*